US006924632B2

(12) United States Patent  
Mariani et al.

(10) Patent No.: US 6,924,632 B2  
(45) Date of Patent: Aug. 2, 2005

(54) FREQUENCY/SIGNAL CONVERTER AND SWITCHING REGULATOR HAVING SUCH A CONVERTER

(75) Inventors: Adalberto Mariani, Garlasco (IT); Giulio Corva, Vittuone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 127 days.

(21) Appl. No.: 10/612,335

(22) Filed: Jul. 2, 2003

(65) Prior Publication Data

US 2004/0066239 A1 Apr. 8, 2004

(30) Foreign Application Priority Data

Jul. 2, 2002 (EP) .............................. 02425435

(51) Int. Cl.⁷ .............................. G05F 1/40; G05F 1/56
(52) U.S. Cl. ...................................... 323/271; 323/282
(58) Field of Search .............................. 323/266, 268, 323/269, 271, 273, 282, 288; 363/159, 163–165

(56) References Cited

U.S. PATENT DOCUMENTS

| 5,521,556 | A | | 5/1996 | O'Shaughnessy et al. |
| 5,677,619 | A | * | 10/1997 | Doluca ........................ 323/282 |
| 5,929,620 | A | | 7/1999 | Dobkin et al. |
| 6,084,483 | A | * | 7/2000 | Keshtbod ..................... 331/57 |
| 6,177,787 | B1 | | 1/2001 | Hobrecht |
| 6,229,293 | B1 | | 5/2001 | Farrenkopf |
| 6,473,280 | B1 | * | 10/2002 | Buxton et al. ................ 361/18 |
| 6,477,070 | B2 | * | 11/2002 | Schweitzer ................... 363/98 |
| 6,847,198 | B2 | * | 1/2005 | Kalpakjian et al. ......... 323/268 |

FOREIGN PATENT DOCUMENTS

| EP | 0 415 244 | 3/1991 |
| EP | 0 769 844 | 4/1997 |
| EP | 0 903 838 | 3/1999 |
| GB | 1 410 530 A | 10/1975 |
| WO | WO98/54837 | 12/1998 |

OTHER PUBLICATIONS

European Search Report for European Patent Application No. 02425435.1 dated Dec. 16, 2002.

* cited by examiner

Primary Examiner—Matthew V. Nguyen  
(74) Attorney, Agent, or Firm—Lisa K. Jorgenson; Stephen Bongini; Fleit, Kain, Gibbons, Gutman, Bongini & Bianco P.L.

(57) ABSTRACT

A frequency/signal converter is provided that receives an input clock signal and generates an output signal. The converter includes a first circuit that receives the input clock signal and generates first and second logic signals that are complementary with one another, a loop circuit that includes a first circuit line and a second circuit line that are each coupled between a first supply voltage and a second supply voltage, and an integrator device. A current proportional to the output signal of the converter flows in the loop circuit. The first and second circuit lines include first and second capacitive elements and first and second switches for interrupting current flow into the first and second capacitive elements, respectively. The first and second switches are controlled by the first and second logic signals, respectively. The first and second circuit lines are alternatively coupled to an input terminal of the integrator device in order to obtain a substantially constant voltage signal at the input terminal of the integrator device, and the integrator device provides the output signal of the converter. Also provided is a switching regulator for providing a regulated voltage to a load.

11 Claims, 5 Drawing Sheets

FREQUENCY/SIGNAL CONVERTER AND SWITCHING REGULATOR HAVING SUCH A CONVERTER

CROSS-REFERENCE TO RELATED APPLICATIONS

This application is based upon and claims priority from European Patent Application No. 02425435.1, filed Jul. 2, 2002, the entire disclosure of which is herein incorporated by reference.

BACKGROUND OF THE INVENTION

1. Field of the Invention

The present invention relates to electronic circuits, and more specifically to a frequency/signal converter and a switching regulator having such a frequency/signal converter.

2. Description of Related Art

In the electronics field, circuits adapted to generate signals that are proportional to the clock frequency of electronic devices are often employed. Typically circuits employing conventional phase-locked loops (PLL) are used. A conventional PLL includes a phase detector of an input signal, a filter, an amplifier, and a voltage controlled oscillator (VCO). When the lock occurs, the VCO control voltage is made proportional to the frequency of the input signal.

Frequency/signal converters can be utilized in other applications such as in switching regulators. These regulators provide a substantially constant output voltage to a load from a fluctuating input voltage, and include a switch, for example a transistor, coupled in series or in parallel with the load and a filter, usually an LC filter. Generally these transistors are driven by circuitry that controls the turning off and the turning on of the transistor through the definition of a duty-cycle (that is, the rate between the time that the switch is on and the total switching time). Such circuitry usually includes an input clock signal derived from an oscillator that fixes the switching time. A control circuit placed in feedback between the output and the input of the regulator makes the output voltage stable against load variances and input voltage fluctuations.

In the case of current mode switching regulators (that is, regulators controlled by a current signal), the control circuitry takes the current flowing through an inductance and compares it with a current derived from a transconductance amplifier that receives the output voltage of the regulator and a voltage reference. The control circuitry acts on the turning on and off circuitry of the transistor. When the duty-cycle exceeds 50%, current mode switching regulators become unstable. For this reason, a slope compensation signal is injected into the current control signal.

One current mode switching regulator is described in U.S. Pat. No. 5,929,620. This switching regulator is synchronized by an external clock signal and includes a PLL circuit that synchronizes the oscillator of its VCO with the external clock signal. The phase locked loop synchronizes the oscillator of the VCO without interfering with a slope compensation signal produced by the same VCO and which is added to the current control signal. However, the PLL circuit is not stable and it is necessary to make it stable by adding a compensation network.

SUMMARY OF THE INVENTION

In view of these drawbacks, it is an object, of the present invention to overcome the above-mentioned drawbacks and to provide a frequency/signal converter that is simpler than conventional converters.

One embodiment of the present invention provides a frequency/signal converter that receives an input clock signal and generates an output signal. The converter includes a first circuit, a loop circuit, and an integrator device. The first circuit receives the input clock signal and generates first and second logic signals that are complementary with one another. The loop circuit includes a first circuit line and a second circuit line that are each coupled between a first supply voltage and a second supply voltage. A current proportional to the output signal of the converter flows in the loop circuit. The first circuit line includes a first capacitive element, and a first switch for interrupting current flow into the first capacitive element. The second circuit line includes a second capacitive element, and a second switch for interrupting current flow into the second capacitive element. The first switch is controlled by the first logic signal, and the second switch is controlled by the second logic signal. The first and second circuit lines are alternatively coupled to an input terminal of the integrator device in order to obtain a substantially constant voltage signal at the input terminal of the integrator device, and the integrator device provides the output signal of the converter.

Another embodiment of the present invention provides a switching regulator for providing a regulated voltage to a load. The regulator includes a first transistor, at least one inductance, first and second circuits, a control circuit, and a device. The first transistor has a first terminal coupled to an input terminal and a second terminal coupled to the output terminal of the regulator, and the inductance is coupled between the second terminal of the transistor and the output terminal of the regulator. The first circuit is coupled to the output terminal and provides a feedback signal that is representative of the regulated voltage. The second circuit is coupled to the inductance and provides a second signal that is representative of the current flowing through the inductance. The control circuit receives an input clock signal and drives the first transistor so as to interrupt a current flow from the input terminal to the output terminal according to a predetermined duty-cycle. The device receives the input clock signal and generates a slope compensation signal that is proportional to the frequency of the input clock signal when the duty-cycle exceeds a predetermined value. The slope compensation signal is coupled to the control circuit. In one preferred embodiment, the regulator also includes a comparator for comparing a sum of the feedback signal and the slope compensation signal with the second signal.

The present invention makes it is possible to form a frequency/signal converter that is stable without a compensation network. The converter can be used to generate a slope compensation signal in a switching regulator.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
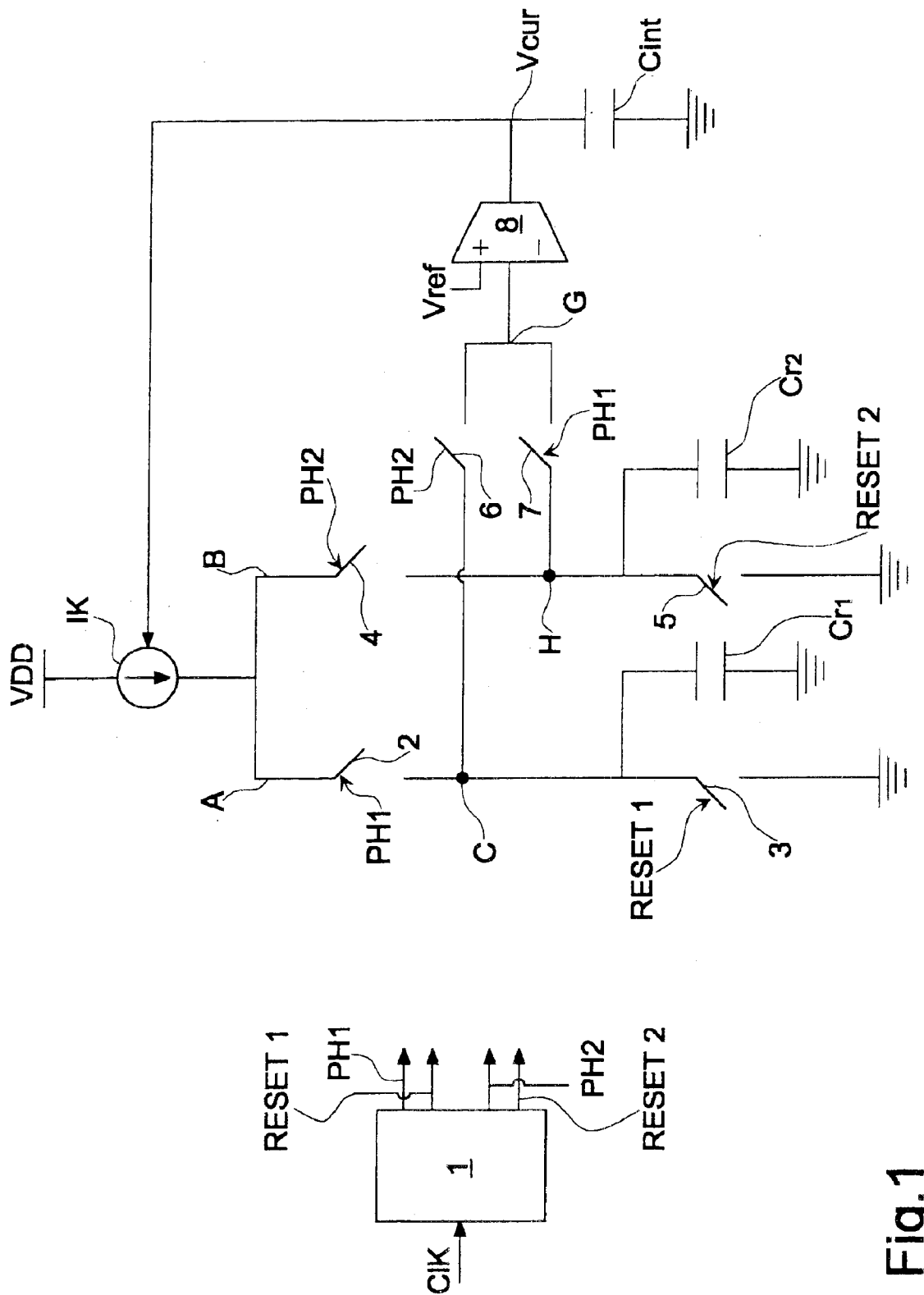
FIG. 1 is a circuit diagram of a frequency/signal converter according to a preferred embodiment of the present invention.
Figure 2:
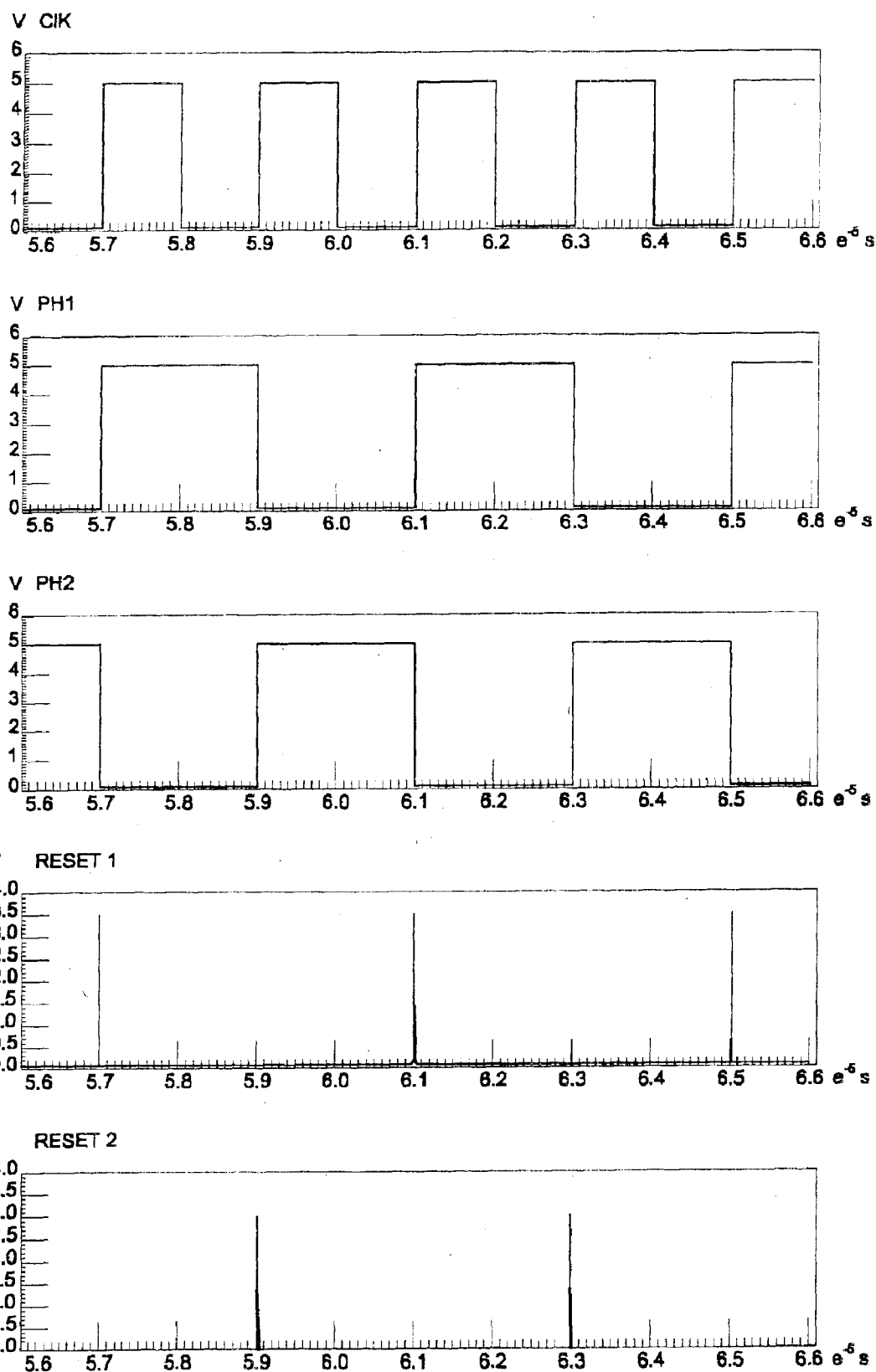
FIG. 2 shows timing diagrams of signals in the converter of FIG. 1.
Figure 3:
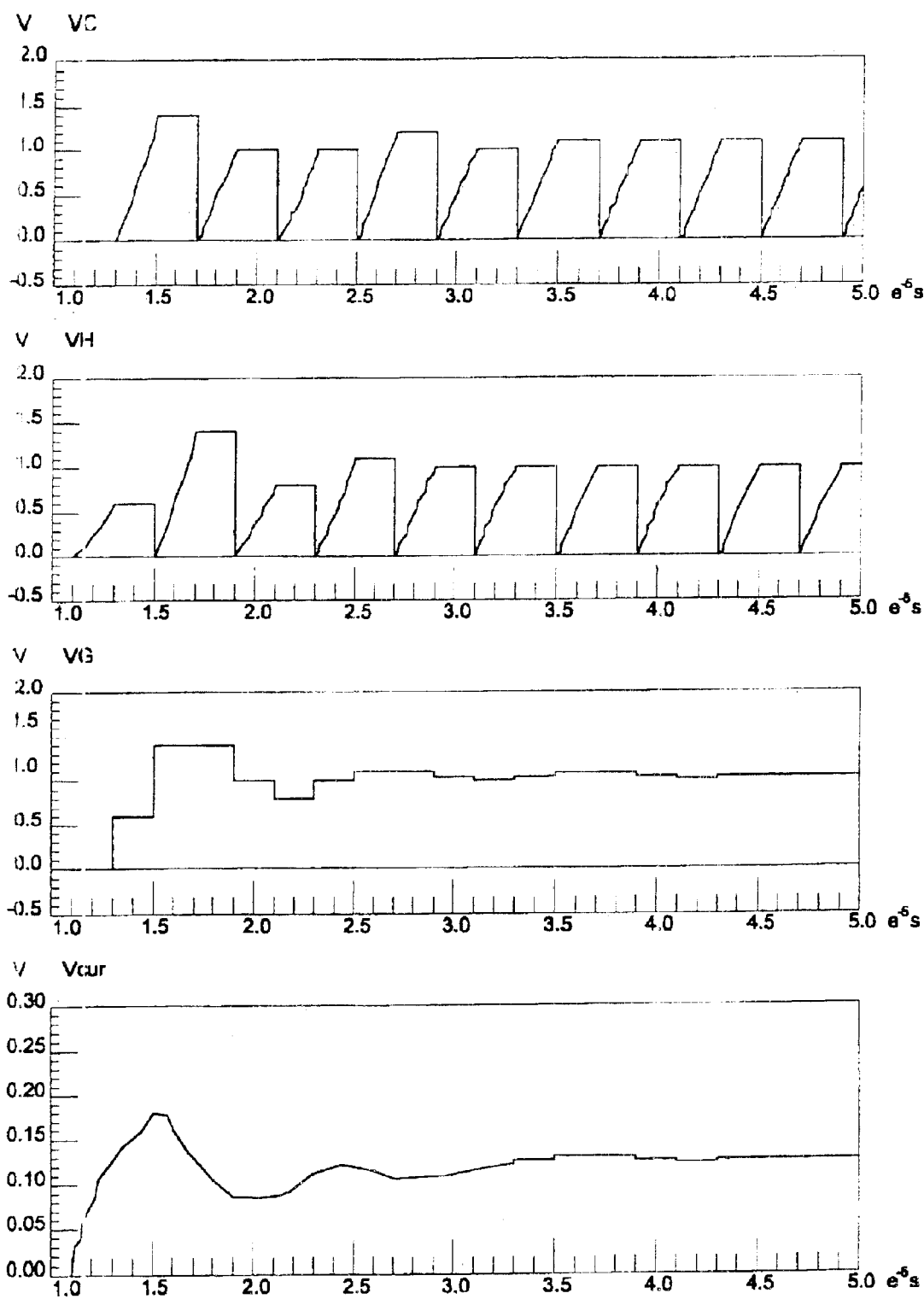
FIG. 3 shows timing waveforms of the output voltage signal and signals at some nodes of the converter circuit of FIG. 1.

FIG. 1 shows a frequency/signal converter according to one embodiment of the present invention. The converter circuit includes a flip-flop 1 of the toggle type which generates, from a synchronization signal or clock signal Clk (that is, a square wave signal having a period T which is preferably derived from an oscillator), two logic signals PH1 and PH2 which are complementary with each other in a time period 2T, and two pulse signals RESET1 and RESET2 which are sensitive to the respective rising edges of the logic signals PH1 and PH2. These signals are shown in FIG. 2.

The converter circuit also includes two lines A and B which have respective switch couples 2 and 3 and 4 and 5. The lines A and B are in parallel to each other and are arranged in a supply path between a supply voltage VDD and ground. The line intermediate nodes C and H are connected with the terminals of two switches 6 and 7, which have their other terminals in common at a node G. Node G is connected with the inverting input of a transconductance error operational amplifier 8 that has a transconductance gain gm, and the non-inverting input is connected with a reference voltage Vref. The output current from the amplifier 8 is integrated by a capacitor Cint, which is connected between the output terminal of the amplifier 8 and ground, in order to produce a voltage Vcur. This voltage Vcur is input to a transconductor circuit IK that is adapted to generate a current I, which flows in the lines A and B and which is obtained by I=Kc*Vcur. The nodes C and H are connected with two capacitor Cr1 and Cr2 which have the same value Cr and have their other terminals connected to ground.

The logic signals PH1 and PH2 drive the switches 2 and 7 and 4 and 6, respectively. The pulse signals RESET1 and RESET2 drive the switches 3 and 5, respectively. When the logic signal PH1 is at logic level 1, after the pulse signal RESET1 has discharged to ground the capacitor Cr1 by closing switch 3, the same capacitor is charged by closing switch 2 for a time period T. The voltage at node C is VC=I*T/Cr. When the logic signal PH2 is at level logic 1, the voltage VC is applied at the inverting input of the amplifier 8 and after the pulse signal RESET2 has discharged to ground the capacitor Cr2 by closing switch 5, the same capacitor is charged by closing switch 3 for a time period T. The voltage at node H is always VH=I*T/Cr.

Therefore at the inverting input terminal of the amplifier 8, there is always a voltage VG=I*T/Cr. The difference between the voltages VG and Vref is integrated in the capacitor Cint to obtain a voltage Vcur. Since a certain transitory it is obtained that, at the stationary state, Vg=Vref and from this I=Cr*Vref*f. Therefore it is evident that the current I is proportional to the frequency f=1/T.

From the analysis of the loop gain of the circuit in FIG. 1 it is obtained that, by considering the closing delay of the switches 2 and 7 or 4 and 6, the voltage VG at the inverting node of the amplifier 8 is VG=I*T*$e^{sT}$/Cr, with the exponential factor being due to the above mentioned delay. Since Vcur=VG/(s*Cint) and I=Kc*Vcur, a loop gain for small signals is obtained by:

$$G = \frac{T*e^{sT}*gm*Kc}{s*Cr*Cint}$$

If the effect of the delay is not considered, the loop gain G is a transfer function having a single pole in the origin and a phase margin of 90°. The delay $e^{sT}$ imposes that the frequency of unitary gain (this is the bandwidth of the circuit) is minor of a fraction of the frequency f:

$$BW = \frac{gm*Kc}{2\pi f*Cr*Cint} \leq 0.25*f$$

From this, there is obtained the relation:

$$f \geq \sqrt{\frac{2gmKc}{\pi CintCr}}.$$

Therefore, by means of a frequency f that respects this inequality, a frequency/signal converter is obtained which is stable without compensating.

Alternatively it is possible to insert any integrator instead of the illustrated circuit portion that includes the transconductance amplifier 8 and the capacitor Cint.

Figure 4:
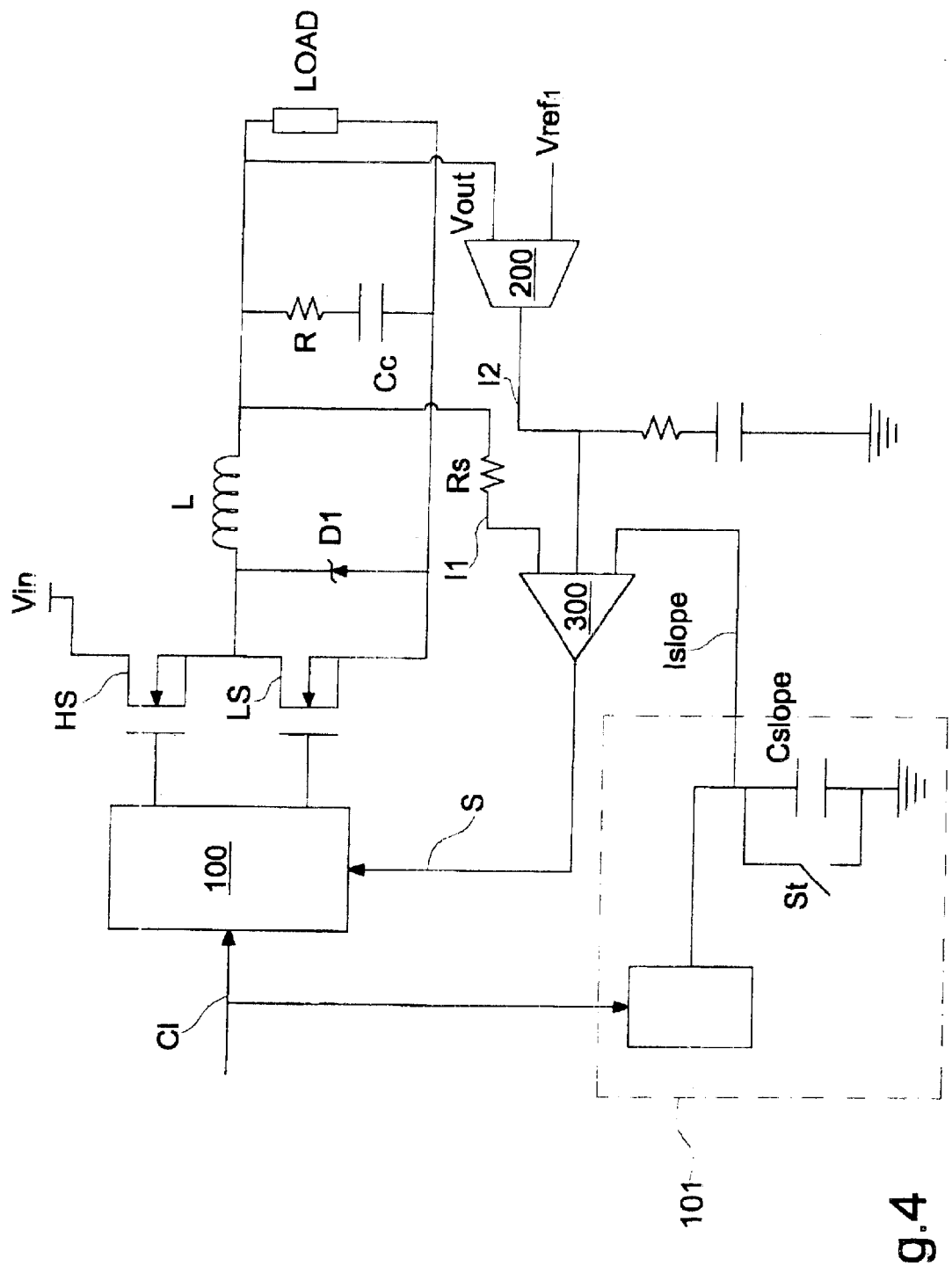
FIG. 4 is a circuit diagram of an exemplary current mode buck converter that includes the converter circuit of FIG. 1.

FIG. 4 shows a switching regulator that employs the converter of FIG. 1. The regulator includes a MOS transistor HS having its drain terminal connected with an input voltage Vin; its source terminal connected with a drain terminal of another MOS transistor LS, with the cathode of a diode D1 whose anode is connected to ground, and with a terminal of an inductance L; and its gate terminal connected with a control device 100. The MOS transistor LS further has its gate terminal connected with the control device 100 and its source terminal connected with ground. The series of a capacitor Cc and a resistor R is placed in parallel with a load LOAD and is connected between the other terminal of the inductance L and ground. A transconductance error operational amplifier 200 receives the output voltage Vout at the terminals of the load LOAD and a reference voltage Vref1. The transconductance error operational amplifier 200 provides a current I2 that is input to a current comparator 300 that also receives a signal I1 representative of the current flowing through the inductance L that is obtained by a sensing resistor Rs (this is a resistor adapted to measure the current in the inductance L) and a slope current signal Islope provided by a device 101. The output signal S of the comparator 300 is input to the control device 100.

The device 101 receives a clock signal C1 and is adapted to determine the duty-cycle D (that is, the on time Ton and the off time Toff in a period Tsw fixed by the clock signal C1), so as to drive the transistors HS and LS. The duty-cycle is varied in relation to the output signal S of the comparator 300.

The device 101 includes the frequency/signal converter of FIG. 1 (described above) from which a current signal proportional to the frequency f of the clock signal C1 is obtained. It flows through a circuit including a capacitor Cslope and a switch St arranged in parallel to the capacitor Cslope and driven so as to generate the slope current signal Islope.

Figure 5:
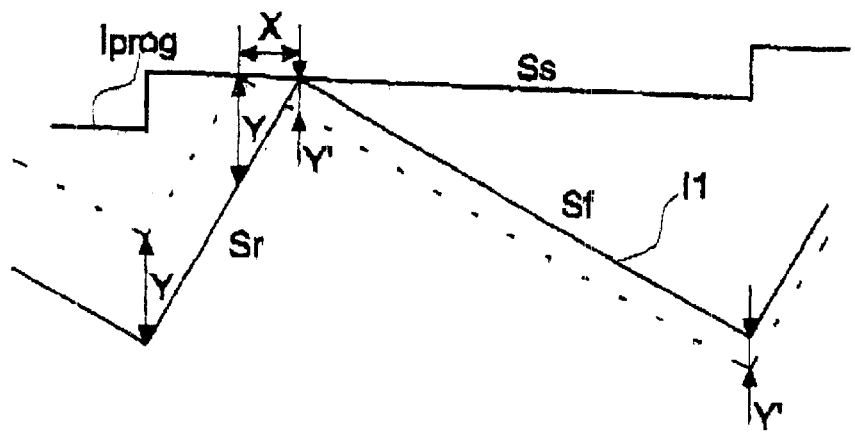
FIG. 5 shows a comparison between signals in two successive time periods.

In order to achieve a good stability for the switching regulator, the inclination of the slope current signal Islope must be equal to about half the negative inclination of the signal I1 during the off time Toff (that is, the inclination of the discharge of the inductance L during the Toff time). This can be deduced by analyzing the stability of the regulator. In this case a perturbation Y is introduced in the current flowing through the inductance L in a certain clock period. At the successive clock period if the regulator is stable the perturbation Y' in the current must be lower than Y. FIG. 5 shows the theoretical signals Iprog and I1 for calculating the inclinations, with Iprog being obtained by I2-Islope, the values of the perturbations Y and Y', the value X obtained by the distance between the peaks of the currents I1 obtained in the two successive clock periods, the rising inclination Sr and the falling inclination Sf of the current I1 and the inclination Slope of the signal Iprog. It is obtained that Sr+Slope=Y/X, Sf+Slope=Y'/X and Y'/Y=(Sf−Slope)/(Sr−Slope). Also because Y'<Y it must result (Sf−Slope)/(Sr−Slope)<1 from which Slope>(Sf−Sr)/2. Since Vout=D*Vin and because Sr=(Vin−Vout)/L this is Sr=Vin*(1−D)/L and Sf=Vout/L from which Sf=Vin*D/L, it is obtained that Slope>Vin*(2D−1)/(2*L). The most restrictive condition is obtained by imposing D=1 from which Slope>Vout/(2*L) and also Slope>Sf/2.

Figure 6:
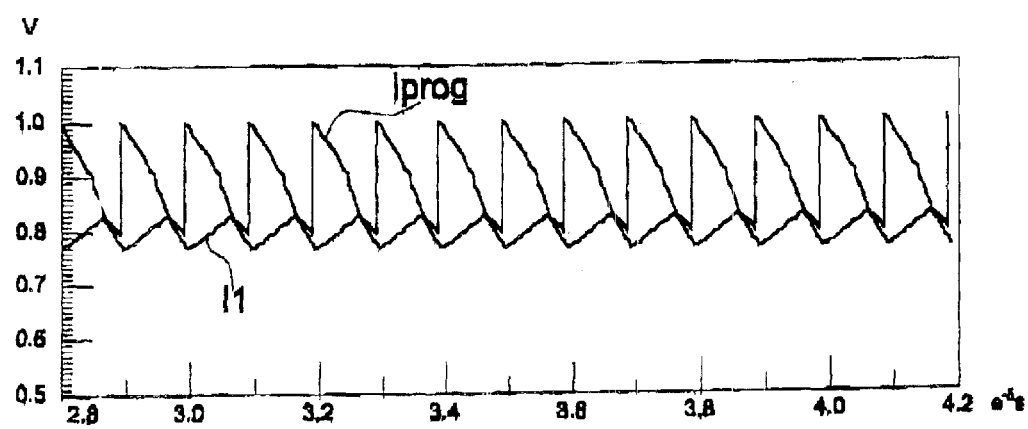
FIG. 6 shows timing diagrams of signals that were derived from simulations.

Therefore it is achieved:

$$\text{Slope} = \frac{V_{out} R_s}{2L}$$

where the inclination of the slope current signal Islope has been indicated with Slope. The value of the inductance L is forever connected with the regulator switching frequency fsw; a higher switching frequency allows use of an inductance having a lower value, therefore L=Lk/fsw where Lk is a proportionality constant. From the above relation it is obtained that Slope=K*fsw by indicating that K=Vout*Rs*/(2*Lk). For this reason it is preferable to change the inclination of the slope compensation signal Islope in a way proportional to the frequency, especially in the case of high switching frequencies, and the device 101 allows this to be achieved. FIG. 6 shows the waveforms of the signals I1 and Iprog which were obtained through simulations of the circuit of FIG. 4, with the inclination Slope of the slope current signal Islope being imposed equal to at least half the highest discharge inclination Sf of the current flowing through the inductance L.

The present invention can be realized in hardware, software, or a combination of hardware and software. Any processor, controller, or other apparatus adapted for carrying out the functionality described herein is suitable. A typical combination of hardware and software could include a general purpose processor (or controller) with a computer program that, when loaded and executed, carries out some or all of the functionality described herein.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A frequency/signal converter receiving an input clock signal and generating an output signal at an output terminal, said converter comprising:

a first circuit receiving the input clock signal and generating first and second logic signals that are complementary with one another;

a loop circuit that includes a first circuit line and a second circuit line that are each coupled between a first supply voltage and a second supply voltage, the first supply voltage being greater than the second supply voltage; and an integrator device, wherein a current proportional to the output signal of the converter flows in the loop circuit, the first circuit line includes a first capacitive element, and a first switch for interrupting current flow into the first capacitive element, the first switch being controlled by the first logic signal, the second circuit line includes a second capacitive element, and a second switch for interrupting current flow into the second capacitive element, the second switch being controlled by the second logic signal, and the first and second circuit lines are alternatively coupled to an input terminal of the integrator device in order to obtain a substantially constant voltage signal at the input terminal of the integrator device, the integrator device providing the output signal of the converter.

2. The converter according to claim 1, wherein the first and second logic signals have a period that is twice the period of the input clock signal.

3. The converter according to claim 2, wherein the first and second logic signals each has a value of logic one for one half of its period and a value of logic zero for the other half of its period.

4. The converter according to claim 1, wherein the integrator device includes:

a transconductance operational amplifier, the amplifier receiving the substantially constant voltage signal at its inverting input terminal and a reference voltage at its non-inverting terminal; and a third capacitive element, wherein the amplifier provides a current signal that is integrated by the third capacitive element so as to produce the output signal of the converter.

5. The converter according to claim 1, wherein the first circuit line further includes a third switch for discharging the first capacitive element, and the second circuit line further includes a fourth switch for discharging the second capacitive element.

6. The converter according to claim 5, wherein the third and fourth switches are controlled by pulse signals that correspond to the rising edges of the first and second logic signals.

7. An integrated circuit including at least one frequency/signal converter that receives an input clock signal and generates an output signal at an output terminal, said converter comprising:

a first circuit receiving the input clock signal and generating first and second logic signals that are complementary with one another;

a loop circuit that includes a first circuit line and a second circuit line that are each coupled between a first supply voltage and a second supply voltage, the first supply voltage being greater than the second supply voltage; and an integrator device, wherein a current proportional to the output signal of the converter flows in the loop circuit, the first circuit line includes a first capacitive element, and a first switch for interrupting current flow into the first capacitive element, the first switch being controlled by the first logic signal, the second circuit line includes a second capacitive element, and a second switch for interrupting current flow into the second capacitive element, the second switch being controlled by the second logic signal, and the first and second circuit lines are alternatively coupled to an input terminal of the integrator device in order to obtain a substantially constant voltage signal at the input terminal of the integrator device, the integrator device providing the output signal of the converter.

8. The integrated circuit according to claim 7, wherein the first and second logic signals have a period that is twice the period of the input clock signal.

9. The integrated circuit according to claim 8, wherein the first and second logic signals each has a value of logic one for one half of its period and a value of logic zero for the other half of its period.

10. The integrated circuit according to claim 7, wherein the integrator device includes;

a transconductance operational amplifier, the amplifier receiving the substantially constant voltage signal at its inverting input terminal and a reference voltage at its non-inverting terminal; and a third capacitive element, wherein the amplifier provides a current signal that is integrated by the third capacitive element so as to produce the output signal of the converter.

11. The integrated circuit according to claim 7, wherein the first circuit line further includes a third switch for discharging the first capacitive element, the second circuit line further includes a fourth switch for discharging the second capacitive element, and the third and fourth switches are controlled by pulse signals that correspond to the rising edges of the first and second logic signals.

* * * * *